(12) United States Patent
Tang et al.

(10) Patent No.: US 8,933,720 B2
(45) Date of Patent: Jan. 13, 2015

(54) APPARATUS FOR CONDUCTING AUTOMATED MAINTENANCE OF A TEST CONTACTOR MODULE

(75) Inventors: Yui Kin Tang, Kwai Chung (HK); Chak Tong Sze, Kwai Chung (HK); Pei Wei Tsai, Kwai Chung (HK); Cho Hin Cheuk, Kwai Chung (HK); Kut Lam, Kwai Chung (HK)

(73) Assignee: ASM Technology Singapore Pte Ltd, Singapore (SG)

( * ) Notice: Subject to any disclaimer, the term of this patent is extended or adjusted under 35 U.S.C. 154(b) by 124 days.

(21) Appl. No.: 13/370,713

(22) Filed: Feb. 10, 2012

(65) Prior Publication Data

US 2013/0207684 A1 Aug. 15, 2013

(51) Int. Cl.
*G01R 31/20* (2006.01)
*G01R 31/00* (2006.01)

(52) U.S. Cl.
USPC .................... 324/758.01; 324/756.01

(58) Field of Classification Search
None
See application file for complete search history.

(56) References Cited

U.S. PATENT DOCUMENTS

| 2,914,058 | A | * | 11/1959 | Sommer | 125/11.03 |
| 5,412,328 | A | * | 5/1995 | Male et al. | 324/754.23 |
| 6,255,827 | B1 | * | 7/2001 | Farooq et al. | 324/537 |
| 6,621,261 | B2 | * | 9/2003 | Tsuchiya | 324/756.05 |
| 2006/0149491 | A1 | * | 7/2006 | Flach et al. | 702/107 |
| 2007/0013362 | A1 | * | 1/2007 | Loh et al. | 324/158.1 |
| 2007/0178814 | A1 | * | 8/2007 | Sato et al. | 451/49 |
| 2007/0229102 | A1 | * | 10/2007 | Eldridge et al. | 324/754 |
| 2009/0042494 | A1 | * | 2/2009 | Moon et al. | 451/443 |
| 2010/0097075 | A1 | * | 4/2010 | Sze et al. | 324/555 |
| 2010/0255760 | A1 | * | 10/2010 | Marshall, Jr. | 451/41 |
| 2010/0264935 | A1 | * | 10/2010 | Erdman et al. | 324/537 |

FOREIGN PATENT DOCUMENTS

JP 2001099892 A * 4/2001

* cited by examiner

*Primary Examiner* — Melissa Koval
*Assistant Examiner* — Courtney McDonnough
(74) *Attorney, Agent, or Firm* — Ostrolenk Faber LLP

(57) ABSTRACT

An apparatus for maintaining a conductivity of electrical contacts of a test contactor for testing electronic devices comprises a rotary turret disk having a plurality of test stands operative to hold respective electronic devices, the electronic devices being rotatable by the rotary turret disk to a position of the test contactor to be contacted by the electrical contacts during testing. At least one contactor maintenance stand comprising a maintenance component is located between adjacent test stands on the rotary turret disk, wherein the electrical contacts of the test contactor are adapted to engage the maintenance component so as to automatically clean the electrical contacts and/or verify the conductivity thereof.

23 Claims, 4 Drawing Sheets

US 8,933,720 B2

APPARATUS FOR CONDUCTING AUTOMATED MAINTENANCE OF A TEST CONTACTOR MODULE

FIELD OF THE INVENTION

The invention relates to a test contactor module for testing electronic devices, such as Light-Emitting Diode ("LED") devices, and in particular to the maintenance of such a test contactor module.

BACKGROUND AND PRIOR ART

Conventional electrical testers usually comprise electrical contacts such as contact probes, and an insulation socket cooperating with the contact probes. Devices under test ("DUT") are placed onto the insulation socket and the contact probes make electrical contact with the DUT mounted on the insulation socket during testing.

FIG. 1 is an isometric view of a conventional rotary turret disk 100 having multiple test stands 102. There are a total of sixteen test stands 102 installed in the illustrated rotary turret disk 100. The test stands 102 are positioned along a perimeter of the rotary turret disk 100, and are equally spaced from one another. Each test stand 102 has an insulation socket 104 positioned on top of it surface for mounting a DUT for testing.

Pick arms are generally used for transferring the DUT to the insulation socket 104 and to remove the DUT after testing. The position of a test contactor module is generally fixed and the contact probes of the test contactor module are used to make the necessary electrical contact for electrically testing the DUT. Thus, the rotary turret disk 100 rotates incrementally to position each test stand 102 and insulation socket 104 at a position of the test contactor module in order to conduct electrical tests on the DUT.

For production of LED devices in particular, electrical tests have to be performed on the LEDs, and the performance of the contact probes will affect the test results. Amongst the tests carried out, a forward voltage test requires the contact probes to have very good electrical conductivity, otherwise a large variation in the forward voltage or Vf range and unreliable production test yields will result. In order to overcome this, an operator has to monitor the test results and clean the contact probes manually either periodically to ensure good performance, or whenever necessary if test results are unsatisfactory.

In common practice, the contact probes need to be manually cleaned to retain good conductivity of the contact probes to remove contaminants, whether after long machine stoppage or bad contact, or under abnormal testing conditions such as Vf measurement fluctuation, and so on. This requires the testing machine's operations to be halted and leads to downtime. It is very time-consuming and wastes manpower.

SUMMARY OF THE INVENTION

Thus, the invention seeks to provide an apparatus for automatically maintaining the conductivity of the contact probes of test contactor modules, such as by cleaning and verifying the conductivity of the contact probes, without time-consuming manual intervention.

According to a first aspect of the invention, there is provided an apparatus for maintaining a conductivity of electrical contacts of a test contactor for testing electronic devices, comprising: a rotary turret disk having a plurality of test stands operative to hold respective electronic devices, the electronic devices being rotatable by the rotary turret disk to a position of the test contactor to be contacted by the electrical contacts during testing; and at least one contactor maintenance stand comprising a maintenance component that is located between adjacent test stands on the rotary turret disk; wherein the electrical contacts of the test contactor are adapted to engage the maintenance component so as to automatically clean the electrical contacts and/or verify the conductivity thereof.

According to a second aspect of the invention, there is provided a testing machine comprising: a test contactor having electrical contacts for testing electronic devices; a rotary turret disk having a plurality of test stands operative to hold respective electronic devices, the electronic devices being rotatable by the rotary turret disk to a position of the test contactor to be contacted by the electrical contacts during testing; and at least one contactor maintenance stand comprising a maintenance component for maintaining a conductivity of the electrical contacts, the contactor maintenance stand being located between adjacent test stands on the rotary turret disk; wherein the electrical contacts of the test contactor are adapted to engage the maintenance component so as to automatically clean the electrical contacts and/or verify the conductivity thereof.

According to a third aspect of the invention, there is provided a method of maintaining a conductivity of electrical contacts of a test contactor for testing electronic devices, the method comprising: holding respective electronic devices on a plurality of test stands located on a rotary turret disk such that the electronic devices are rotatable to a position of the test contactor by the rotary turret disk to be contacted by the electrical contacts for testing; rotating at least one contactor maintenance stand on the rotary turret disk comprising a maintenance component to the position of the test contactor, the contactor maintenance stand being located between adjacent test stands; and driving the electrical contacts of the test contactor to engage the maintenance component so as to automatically clean the electrical contacts and/or verify the conductivity thereof.

It would be convenient hereinafter to describe the invention in greater detail by reference to the accompanying drawings which illustrate one preferred embodiment of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiment of the invention when considered with the accompanying drawings, in which.

DETAILED DESCRIPTION OF THE PREFERRED EMBODIMENT OF THE INVENTION

Figure 1:
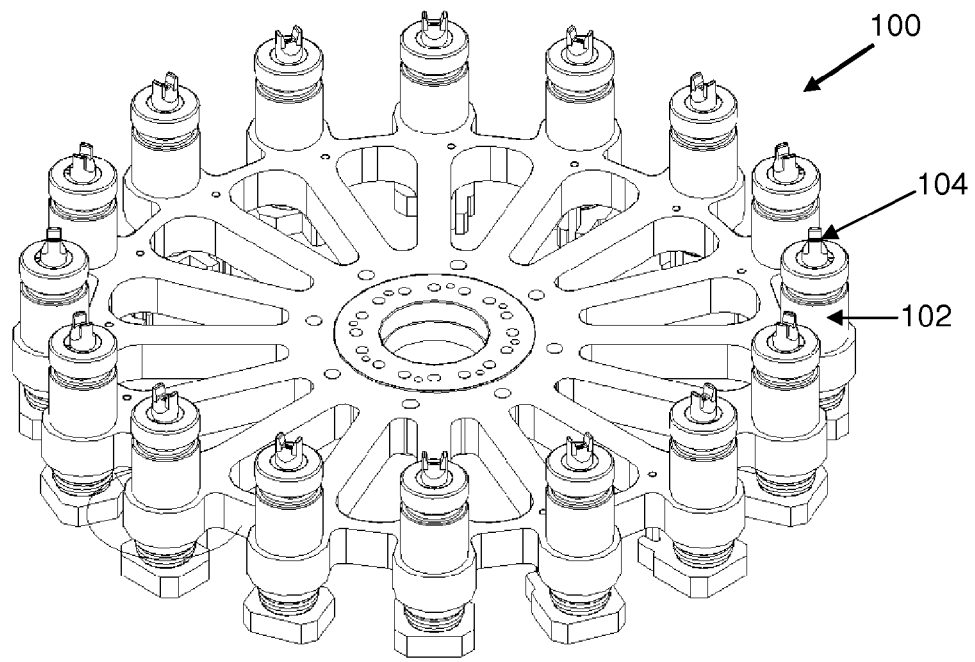
FIG. 1 is an isometric view of a conventional rotary turret disk having multiple test stands.
Figure 2:
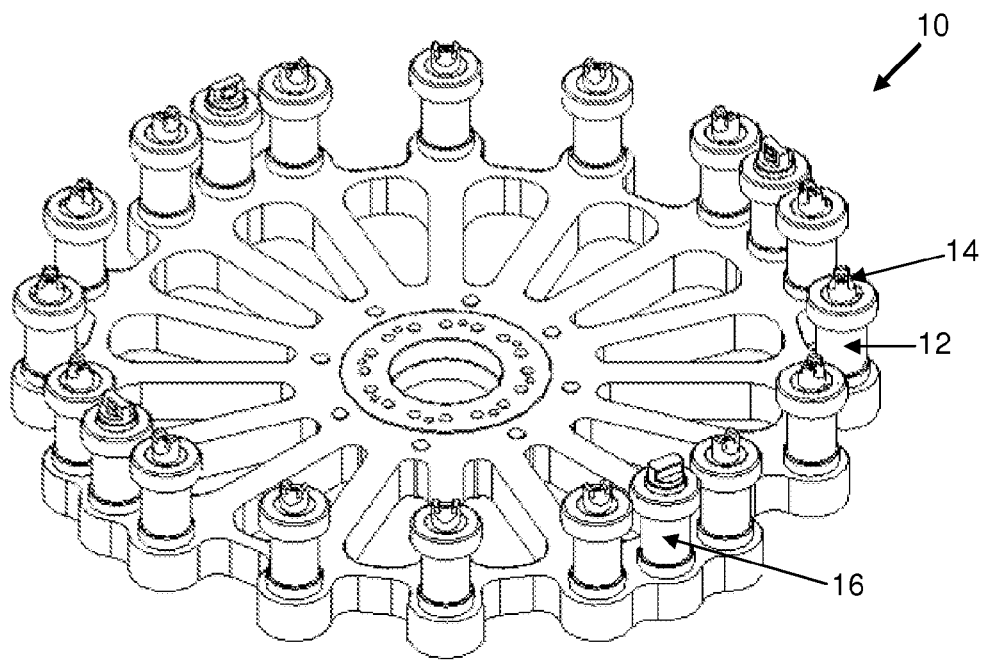
FIG. 2 is an isometric view of a rotary turret disk according to the preferred embodiment of the invention including multiple contactor maintenance stands.

FIG. 2 is an isometric view of a rotary turret disk 10 of a testing machine according to the preferred embodiment of the invention including multiple contactor maintenance stands 16. The rotary turret disk 10 has a plurality of test stands 12 arranged at equal intervals along a perimeter of the rotary turret disk 10. Each test stand 12 includes an insulation socket 14 for holding respective DUT.

Additionally, contactor maintenance stands 16 are included along the perimeter of the rotary turret disk 10 and are located between adjacent test stands 12. Accordingly, the rotary turret disk 10 may be modified so that each contactor maintenance stand 16 is situated at a half-pitch distance or equidistant from its adjacent test stands 10. The contactor maintenance stands 16 should also advantageously be arranged such that they are separated from one another by equal distances. For instance, they are separated by angles of 90° from one another where there are four contactor maintenance modules 16. This helps to maintain a balanced weight distribution around the rotary turret disk 10.

Figure 3:
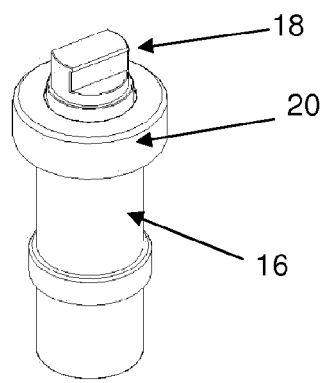
FIG. 3 is an isometric view of a component holder that is mountable at a contactor maintenance stand.

FIG. 3 is an isometric view of a component holder 18 that is mountable at the contactor maintenance stand 16. The component holder 18 is designed to mount a maintenance component that is usable for the purpose of maintaining and verifying the conductivity of contact probes of a test contactor module (see below). A locking cap 20 may be used for releasably locking the component holder 18 and the maintenance component held by the component holder 18 onto the contactor maintenance stand 16.

Figure 4A:
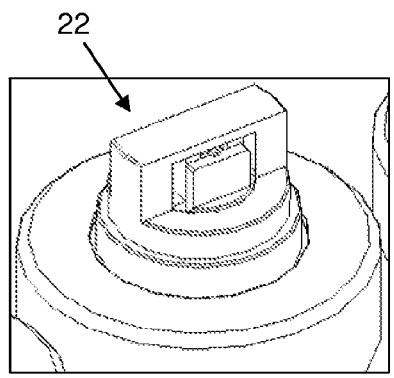
FIGS. 4(a) to 4(d) are isometric views of various components that may be held by the component holders to construct respective maintenance stands.

FIGS. 4(a) to 4(d) are isometric views of various components that may be held by the component holders 18 to construct respective contactor maintenance stands 16. FIG. 4(a) is a contactor maintenance stand 16 comprising a diagnostic head 22. The diagnostic head 22 may be used for checking an electrical resistance of contact probes of a test contactor module.

Figure 4B:
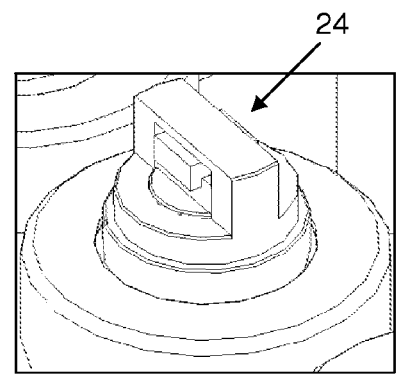

FIG. 4(b) is a contactor maintenance stand 16 comprising a grinding head 24. It can be used for removing contaminants such as dirt, debris and oxidized material on the surfaces of the contact probes, for instance, when inspection by the diagnostic head 22 indicates the build-up of contaminants on the contact probes. The grinding head 24 is particularly useful to clean contact probes with flat tips. Further or alternatively, grinding of the contact probes against the grinding head 24 may be performed periodically.

Figure 4C:
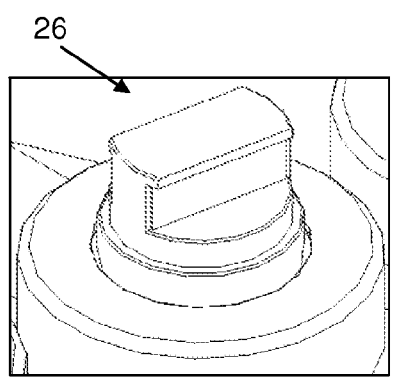

FIG. 4(c) is a contactor maintenance stand 16 comprising a cleaning head 26. The cleaning head 26 is particularly useful for cleaning contact probes with sharp edges so as to remove contaminants such as dirt, debris and oxidized material on the surfaces of sharp edges of the contact probes. After grinding by the grinding head 24 and/or cleaning by the cleaning head 26, the contact probes may be aligned with the diagnostic head 22 for checking the electrical resistances of the contact probes after such cleaning and/or grinding.

Figure 4D:
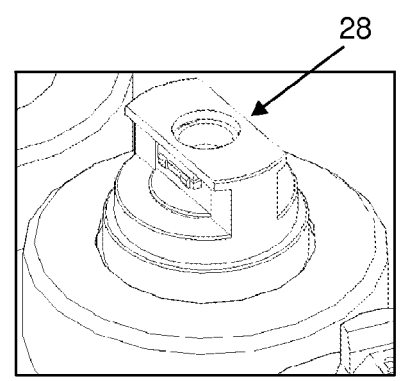

FIG. 4(d) is a contactor maintenance stand 16 comprising a reference or golden unit 28 which is a device with known electrical and optical characteristics that is mounted on the component holder 18. It is used for determining the resistances of the contact probes to verify whether the contact probes are functioning normally after a certain period of use, or whenever necessary.

The above maintenance components comprising the diagnostic head 22, grinding head 24, cleaning head 26 and golden unit 28 are examples of components which serve to automatically maintain the reliability and accuracy of the contact probes of a test contactor module by cleaning and/or verifying the conductivity thereof despite long periods of use of the test contactor module. The need to cease testing operations for manual maintenance of the test contactor module can therefore be avoided or reduced.

Figure 5:
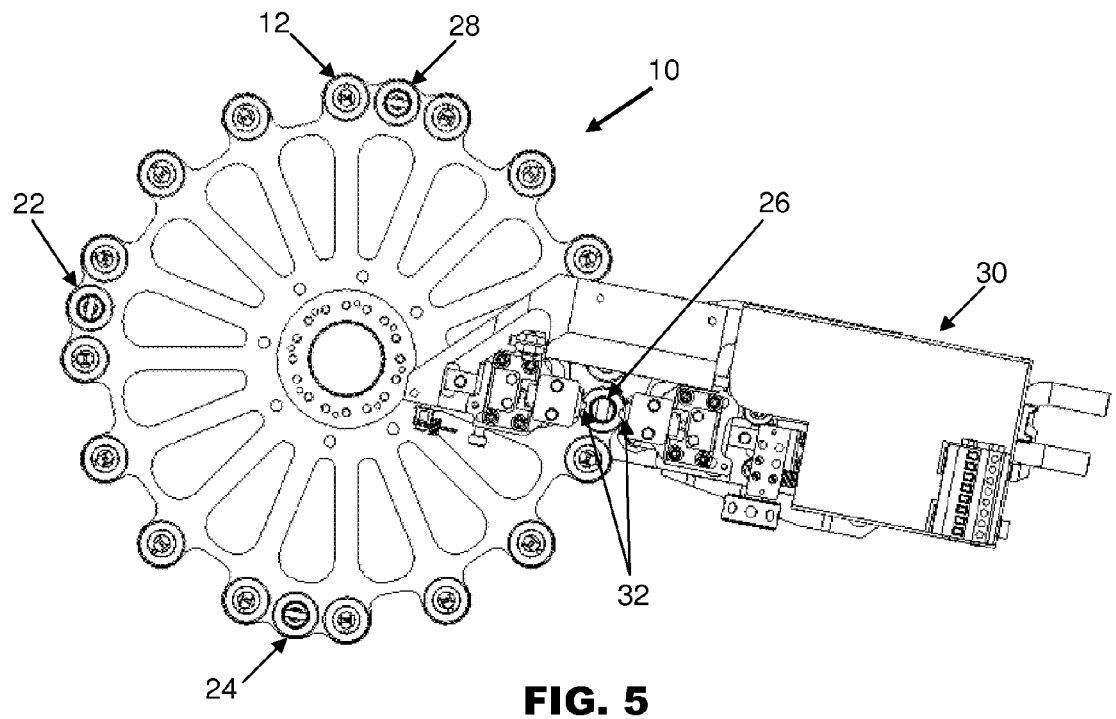
FIG. 5 is a plan view of a test contactor module which is located adjacent to a cleaning head arranged on the circumference of the rotary turret disk.

FIG. 5 is a plan view of a test contactor module 30 which is located adjacent to a cleaning head 26 arranged on the circumference of the rotary turret disk 10. The test contactor module 30 is located at a fixed position while the rotary turret disk 10 incrementally rotates the test stands 12 towards the test contactor module 30 in a predetermined rotary direction. When a DUT held by the test stand 12 arrives at the position of the test contactor module 30, contact probes 32 of the test contactor module 30 will close onto electrical contacts on the DUT. Electrical characteristics of the DUT are then determined.

During maintenance of the contact probes 32 of the test contactor module 30, instead of rotating the rotary turret disk 10 by a full pitch distance between adjacent test stands 12, the rotary turret disk 10 is rotated by a half-pitch distance from an adjacent test stand 12 so that a contactor maintenance stand 16 is situated at the position of the test contactor module 30. In FIG. 5, the cleaning head 26 is located between the contact probes 32. The contact probes 32 then close onto and engage the cleaning head 26 so that tips of the contact probes 32 may be cleaned by the cleaning head 26. Similarly, the contact probes 32 may close onto any other maintenance component held by the component holders 18 of the contactor maintenance stands 16 for the purpose of maintaining and verifying the conductivity of the contact probes 32. After conducting maintenance and/or verification by rotating one or more of the contactor maintenance stands 16 to the test contactor module 30, testing operations may continue when the rotary turret 10 again rotates a test stand 12 to be situated at the test contactor module 30. Testing may continue uninterrupted thereafter until further automatic maintenance activities are desired or necessary.

Figure 6:
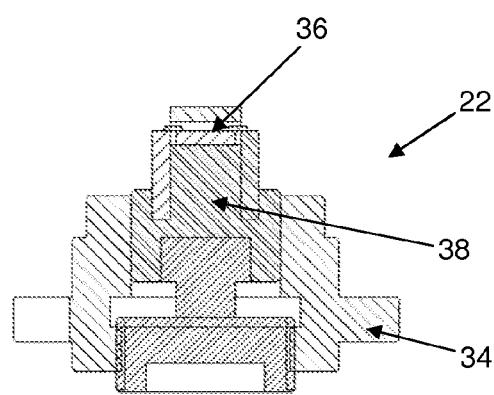
FIG. 6 is a cross-sectional view of a diagnostic head which is mounted onto a contactor maintenance stand.

FIG. 6 is a cross-sectional view of a diagnostic head 22 which is mounted onto a contactor maintenance stand 16. The diagnostic head 22 comprises a resistor 36 having a known value which is located for electrical communication with the contact probes 32 in use. The resistor 36 rests on a package holder 38 inside a housing 34.

When measuring the resistance of DUT in normal operation, the resistance of the contact probes 32 is taken into account. When dirt, debris and oxidized material accumulate on the surfaces of the contact probes 32, this can greatly increase the resistance of the contact probes 32. After a predefined number of running cycles, the testing machine will rotate the rotary turret disk 10 such that the diagnostic head 22 is located at the position of the test contactor module 30. When the contact probes 32 connect with the resistor 36 having a known value, the total resistance of the contact probes 32 and the resistor 36 is measured. The known resistance of the resistor 36 is factored into the measured value in order to determine the resistance of the contact probes 32. If the resistance of the contact probes 32 is too high and exceeds a predefined specification, the testing machine will automatically enter an automatic curing procedure using other contactor maintenance stands 16 in order to remove contaminants from the contact probes 32.

Figure 7:
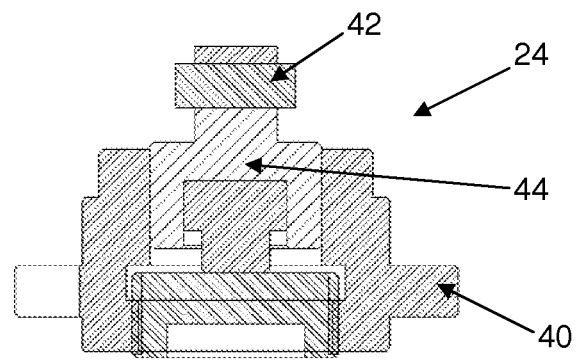
FIG. 7 is a cross-sectional view of a grinding head which is mounted onto a contactor maintenance stand.

FIG. 7 is a cross-sectional view of a grinding head 24 which is mounted onto a contactor maintenance stand 16. The grinding head 24 comprises a steel block 42 with rough and hard surfaces, which surfaces may be made from electroplated diamond. The steel block 42 is resting on a package holder 44 inside a housing 40.

The grinding head 24 is usually used for contact probes 32 with flat tips, to remove dirt, debris and oxidized material on the surfaces of the contact probes 32. The rotary turret disk 10 will first move the grinding head 24 into alignment with the contact probes 32. The contact probes 32 will engage and press onto the grinding surfaces of the steel block 42. According to a preferred embodiment of the invention, the rotary turret disk may vibrate with a small amplitude (such as an amplitude of about 5 µm) to grind the steel block 42 against the contact probes 32. The rubbing action helps to remove contaminants. After grinding, the rotary turret disk 10 may further be rotated to a position where the diagnostic head 22 is aligned with the contact probes 32 so as to check and verify the resultant contact resistance after grinding.

Figure 8:
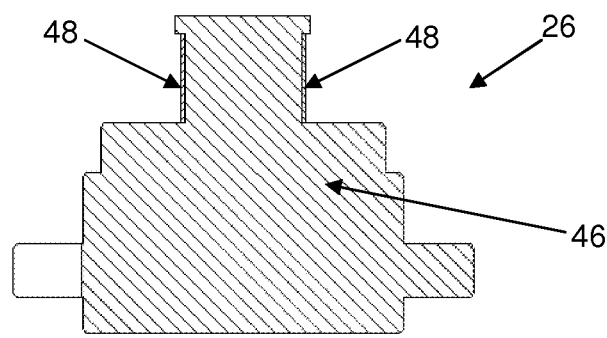
FIG. 8 is a cross-sectional view of a cleaning head which is mounted onto a contactor maintenance stand.

FIG. 8 is a cross-sectional view of a cleaning head 26 which is mounted onto a contactor maintenance stand 16. The cleaning head 26 comprises probe card cleaning sheets 48 which are adhered on opposite vertical sides of a housing 46. The probe card cleaning sheets 48 are arranged so that they are contactable by the contact probes 32 when the contact probes 32 close onto the housing 46 horizontally. It should be appreciated that, besides probe card cleaning sheets 48, other means of cleaning for cleaning the contact probes 32 may be attached to the housing 46.

The rotary turret disk 10 will first rotate to align the cleaning head 26 with the contact probes 32. When they are aligned, sharp edges of the contact probes 32 close onto the housing 46 and engage and pierce into the probe card cleaning sheets 48. Contaminants such as dirt, debris and oxidized material will adhere to the probe card cleaning sheets 48, thereby cleaning the contact probes 32.

After cleaning, the rotary turret disk 10 may further be rotated to a position where the diagnostic head 22 is aligned with the contact probes 32 so as to check and verify the resultant contact resistance after cleaning.

Figure 9:
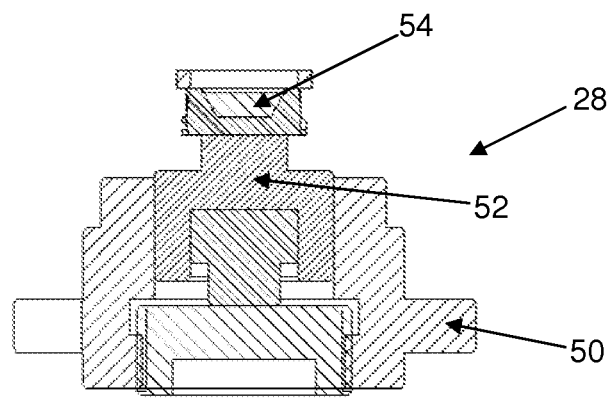
FIG. 9 is a cross-sectional view of a golden unit which is mounted onto a contactor maintenance stand.

FIG. 9 is a cross-sectional view of a golden unit 28 which is mounted onto a contactor maintenance stand 16. The golden unit 28 may comprise an LED reference unit 54 which rests on a package holder 52 located within a housing 50. The LED reference unit 54 has known electrical and optical characteristics. By comparing the test readings of the LED reference unit 54 against the known electrical and optical characteristics of the LED reference unit 54, it can be verified whether the resistance of the contact probe 32 is at an acceptable level.

Thus, the LED reference unit 54 is advantageous for automatic verification of the resistance of the contact probes 32 after cleaning. If the resistance of the contact probes 32 is at an acceptable level, it means that a preceding self-curing operation has been successfully completed. Otherwise, further cleaning by the grinding head 24 and/or cleaning head 26 can be performed until the resistance is at an acceptable level.

It should be appreciated that by adding contactor maintenance stands 16 to the rotary turret disk 10 according to the preferred embodiment of the invention, contact resistance and conductivity of the contact probes 32 can be monitored and automatically cured if necessary. Specifically, automatic checking, cleaning and verification of the conductivity of the contact probes 32 can be performed. Fast conversion for handling different types of packages as well as test heads is possible through the use of locking caps 20 to enable quick exchange of maintenance components held by the component holders 18.

Additionally, the contactor maintenance stands 16 can used as a tool to monitor performance of the testing machine and the operator can be alerted to conduct tester diagnostic and/or calibration if required. When conducting checking with the golden unit 28, data about the optical and electrical measurement obtained from the test contactor module 30 can be monitored. Any measurement data that is out of range can prompt an alert to the operator that the testing machine may require a service check-up.

The invention described herein is susceptible to variations, modifications and/or additions other than those specifically described and it is to be understood that the invention includes all such variations, modifications and/or additions which fall within the spirit and scope of the above description.

The invention claimed is:

1. An apparatus for maintaining conductivity of electrical contacts of a test contactor for testing electronic devices, the apparatus comprising:
a rotary turret disk comprising a plurality of test stands operative to hold respective electronic devices, the electronic devices being rotatable by the rotary turret disk to a position of the test contactor to be contacted by the electrical contacts during testing; and
a first contactor maintenance stand positioned between a first adjacent test stand on the rotary turret disk and a second adjacent test stand on the rotary turret disk, and a second contactor maintenance stand located between a third adjacent test stand on the rotary turret disk and a fourth adjacent test stand on the rotary turret disk, the first contactor maintenance stand being distinct from the second contactor maintenance stand, the first and second contactor maintenance stands comprising, respectively, first and second contactor maintenance components;
wherein the first maintenance component is configured to verify the conductivity of the electrical contacts of the test contactor, and the second contactor maintenance component is configured to clean the electrical contacts of the test contactor when the verification by the first maintenance component indicates a build-up of contaminants on the electrical contacts of the test contactor.

2. The apparatus as claimed in claim 1, wherein the first and second contactor maintenance stands are located along a perimeter of the rotary turret disk.

3. The apparatus as claimed in claim 1, wherein each of the contactor maintenance stands is situated equidistant from its adjacent test stands.

4. The apparatus as claimed in claim 1, further comprising:
a third contactor maintain stand positioned on the rotary turret disk,
wherein the first, second and third contactor maintenance stands are separated from one another by equal distances.

5. The apparatus as claimed in claim 4, wherein the rotary turret disk includes four contactor maintenance stands located thereon, the contactor maintenance stands being separated by angles of 90° from one another.

6. The apparatus as claimed in claim 4, wherein the first maintenance component is a diagnostic head and the second maintenance component comprises a maintenance component selected from the group consisting of: a grinding head and a cleaning head.

7. The apparatus as claimed in claim 1, wherein each of the contactor maintenance stands further comprises:
- a component holder on which the respective maintenance component is mounted; and
- a locking cap configured to lock releasably the component holder onto the contactor maintenance stand.

8. The apparatus as claimed in claim 1, wherein the first contactor maintenance component comprises a diagnostic head which is operative to measure an electrical resistance of the electrical contacts of the test contactor.

9. The apparatus as claimed in claim 8, wherein the diagnostic head comprises a resistor having a known value which is located for electrical communication with the electrical contacts in use.

10. The apparatus as claimed in claim 1, wherein the second contactor maintenance component comprises a grinding head operative to remove contaminants on the electrical contacts.

11. The apparatus as claimed in claim 10, wherein the grinding head comprises a steel block with rough and hard surfaces.

12. The apparatus as claimed in claim 11, wherein the surfaces of the steel block are made from electroplated diamond.

13. The apparatus as claimed in claim 10, wherein the rotary turret disk is operable to vibrate for grinding the electrical contacts against the grinding head.

14. The apparatus as claimed in claim 1, wherein the second maintenance component comprises a cleaning head for cleaning electrical contacts with sharp edges.

15. The apparatus as claimed in claim 14, wherein the cleaning head comprises probe card cleaning sheets positioned and configured to be pierced by the electrical contacts so as to remove contaminants on the electrical contacts in use.

16. The apparatus as claimed in claim 15, wherein the cleaning sheets are adhered on opposite vertical sides of a housing.

17. The apparatus as claimed in claim 1, further comprising a contactor maintenance stand comprising a golden unit electronic device for determining a resistance of the electrical contacts.

18. The apparatus as claimed in claim 17, wherein the golden unit comprises a reference electronic device with known electrical and optical characteristics.

19. The apparatus as claimed in claim 1, wherein the rotary turret disk is rotated by a full pitch distance between the first adjacent test stand and the second adjacent test stand, and rotated by the full pitch distance between the third adjacent test stand and the fourth adjacent test stand, and the rotary turret disk is rotated by a pitch distance less than the full pitch distance between the first adjacent test stand and the first contactor maintenance stand, and rotated by the pitch distance less than the full pitch distance between the third adjacent test stand and the second contactor maintenance stand.

20. A testing machine comprising:
- a test contactor comprising electrical contacts for testing electronic devices;
- a rotary turret disk comprising a plurality of test stands operative to hold respective electronic devices, the electronic devices being rotatable by the rotary turret disk to a position of the test contactor to be contacted by the electrical contacts during testing; and
- a first contactor maintenance stand positioned between a first adjacent test stand on the rotary turret disk and a second adjacent test stand on the rotary turret disk, and a second contactor maintenance stand positioned between a third adjacent test stands stand on the rotary disk and a fourth adjacent test stand on the rotary turret disk, the first contactor maintenance stand being distinct from the second contactor maintenance stand, the first and second contactor maintenance stands comprising, respectively, first and second maintenance components;
- wherein the first maintenance component is configured to verify conductivity of the electrical contacts of the test contactor, and the second maintenance component is configured to clean the electrical contacts of the test contactor when the verification by the first maintenance component indicates a build-up of contaminants on the electrical contacts of the first test contactor.

21. The apparatus as claimed in claim 20, wherein the rotary turret disk is rotated by a full pitch distance between the first adjacent test stand and the second adjacent test stand, and rotated by the full pitch distance between the third adjacent test stand and the fourth adjacent test stand, and the rotary turret disk is rotated by a pitch distance less than the full pitch distance between the first adjacent test stand and the first contactor maintenance stand, and rotated by the pitch distance less than the full pitch distance between the third adjacent test stand and the second contactor maintenance stand.

22. A method of maintaining conductivity of electrical contacts of a test contactor for testing electronic devices, the method comprising:
- holding respective electronic devices on a plurality of test stands located on a rotary turret disk such that the electronic devices are rotatable to a position of the test contactor by the rotary turret disk to be contacted by the electrical contacts for testing;
- rotating a plurality of contactor maintenance stands on the rotary turret disk to the position of the test contact, the plurality of contactor maintenance stands comprising a first contacting maintenance component positioned between a first adjacent test stand on the rotary disk and a second adjacent test stand on the rotary disk, and a second contactor maintenance component located between a third adjacent test stand on the rotary disk and a fourth adjacent test stand on the rotary disk, the first contacting maintenance component being distinct from the second contactor maintenance component;
- verifying the conductivity of the electrical contacts of the test contactor using the first contactor maintenance component; and
- cleaning the electrical contacts of the test contactor using the second maintenance component when the verification by the first maintenance component indicates a build-up of contaminants on the electrical contacts of the test contactor.

23. The apparatus as claimed in claim 22, wherein the rotating comprises:
- rotating the rotary turret disk by the full pitch distance between the first adjacent test stand and the second adjacent test stand, rotating the rotary turret disk by the full pitch distance between the third adjacent test stand and the fourth adjacent test stand, rotating the rotary turret disk by a pitch distance less than the full pitch distance between the first adjacent test stand and the first contactor maintenance stand, and rotating the rotary turret disk by the pitch distance less than the full pitch distance between the third adjacent test stand and the second contactor maintenance stand.

* * * * *